(12) United States Patent
Nishikawa et al.

(10) Patent No.: US 7,671,335 B2
(45) Date of Patent: Mar. 2, 2010

(54) INFRARED DETECTOR AND PROCESS FOR FABRICATING THE SAME

(75) Inventors: Takayuki Nishikawa, Yao (JP); Sadayuki Sumi, Ashiya (JP); Tomohiro Kamitsu, Kobe (JP); Ryo Taniguchi, Tsu (JP); Masaya Hirata, Hirakata (JP); Shin Sato, Katano (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 384 days.

(21) Appl. No.: 11/883,361

(22) PCT Filed: Nov. 8, 2006

(86) PCT No.: PCT/JP2006/322688

§ 371 (c)(1),
(2), (4) Date: Jul. 31, 2007

(87) PCT Pub. No.: WO2007/060861

PCT Pub. Date: May 31, 2007

(65) Prior Publication Data
US 2008/0111087 A1    May 15, 2008

(30) Foreign Application Priority Data

Nov. 22, 2005 (JP) .............................. 2005-337650
Jul. 14, 2006 (JP) .............................. 2006-194745
Jul. 14, 2006 (JP) .............................. 2006-194746

(51) Int. Cl.
*G01J 5/20* (2006.01)
(52) U.S. Cl. .................................................. 250/338.4
(58) Field of Classification Search .... 250/338.1–338.5
See application file for complete search history.

(56) References Cited

U.S. PATENT DOCUMENTS 4,302,674 A * 11/1981 Adachi et al. ............ 250/338.3

(Continued)

FOREIGN PATENT DOCUMENTS

EP    0 363 520 A1    4/1990

(Continued)

OTHER PUBLICATIONS

International Search Report for PCT/JP2006/322688 (PCT/ISA/210) dated Apr. 26, 2007 (3 pages).

(Continued)

*Primary Examiner*—David P Porta
*Assistant Examiner*—Kiho Kim
(74) *Attorney, Agent, or Firm*—Cheng Law Group, PLLC

(57) ABSTRACT

An infrared detector includes a circuit block carrying an infrared sensor element and electronic components. The circuit block is composed of a dielectric resin layer and a first substrate formed with a circuit pattern and mounting the electronic components. The dielectric resin layer is formed in its top with a recess which defines around its periphery with a shoulder for supporting opposite ends of the infrared sensor. The first substrate is integrated to the lower end of the dielectric resin layer with at least one of the electronic components being molded into the dielectric resin layer to make the circuit block of a unified mold structure. Thus, a part or all of the electronic components are molded into the dielectric layer to realize the circuit block of a simple and low profile structure, while retaining an advantage of keeping the infrared sensor element sufficiently away from the electronic components and an associated electronic circuit, thereby assuring to give the infrared detector which is simple in construction, economical in cost, and reliable in the infrared detection.

21 Claims, 7 Drawing Sheets

U.S. PATENT DOCUMENTS

| | | | | |
|---|---|---|---|---|
| 4,437,002 A | * | 3/1984 | Taniguchi et al. | 250/338.3 |
| 4,851,682 A | * | 7/1989 | Moriyama et al. | 250/338.3 |
| 5,344,518 A | * | 9/1994 | Ito et al. | 156/242 |
| 5,391,875 A | * | 2/1995 | Cederberg et al. | 250/352 |
| 5,420,426 A | * | 5/1995 | Inoue | 250/338.3 |
| 2005/0035421 A1 | * | 2/2005 | Kayanuma et al. | 257/432 |

FOREIGN PATENT DOCUMENTS

| | | | |
|---|---|---|---|
| JP | 2004-354172 A | 12/2004 | |
| WO | WO-04/001908 A1 | 12/2003 | |

OTHER PUBLICATIONS

Written Opinion of the International Searching Authority for PCT/JP2006/322688 (PCT/ISA/237) dated Apr. 26, 2007 (4 pages).

* cited by examiner

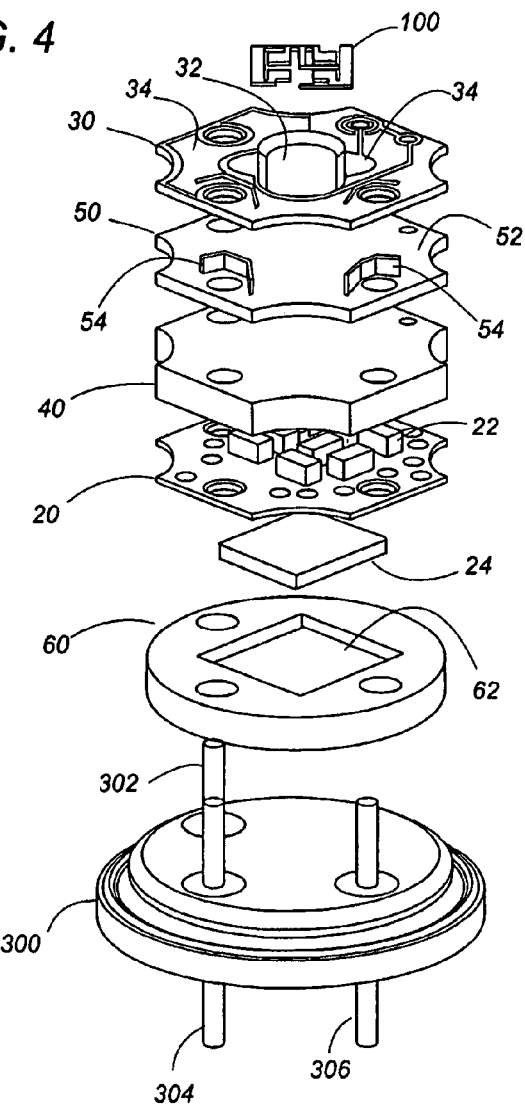
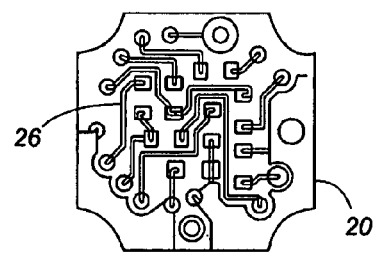
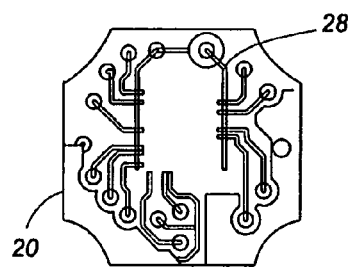
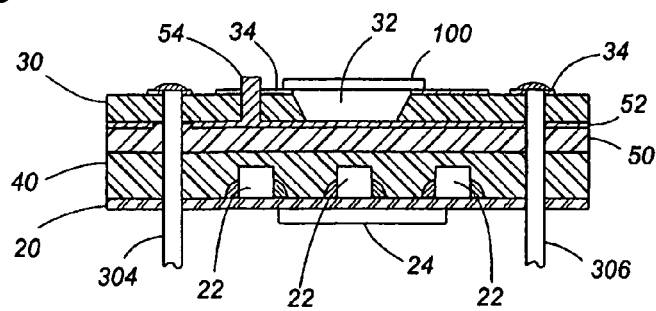

INFRARED DETECTOR AND PROCESS FOR FABRICATING THE SAME

TECHNICAL FIELD

The present invention is directed to an infrared detector, more particularly to an infrared sensor including an infrared sensor element and an associated electronic circuit commonly mounted on a single circuit block, and a process of fabricating the infrared detector.

BACKGROUND ART

WO 2004/00198 A1 discloses a prior infrared detector which comprises a circuit block carrying an infrared sensor element, and a case accommodating therein the circuit block. The circuit block is prepared as an injection molded plastic body or so-called molded interconnect device (MID) for mounting, in addition to the infrared sensor element, various electronic components constituting a signal processing circuit which provides a detection output. In order to make the infrared detector compact, i.e., to arrange various electronic components within a limited space, the circuit block is specifically designed into a rather complicated three-dimensional shape in correspondence with the number and kinds of the electronic components, and is therefore fabricated only at an increased cost. Also for electrical connection of the infrared sensor element to the electronic components, the three-dimensional circuit block has to incorporate a correspondingly complicated circuit pattern or conductors, thereby adding an additional fabrication cost. Therefore, there is a demand for fabricating the compact circuit block or the infrared detector at a reduced cost.

DISCLOSURE OF THE INVENTION

In view of the above problem, the present invention has been accomplished to provide an infrared detector which is capable of being fabricated at a reduced cost, yet assuring optimum performance. The infrared detector in accordance with the present invention includes a circuit block carrying an infrared sensor element and electronic components, and a case enclosing the circuit block. The circuit block is composed of a dielectric resin layer and a first substrate which is formed with a circuit pattern for mounting the electronic components. The dielectric resin layer is formed in its top with a recess which defines around its periphery with a shoulder for supporting opposite ends of the infrared sensor. The recess defines a thermal insulation space below the infrared sensor to give a reliable output without being adversely affected by heat developed at the electronic components. The feature of the present invention resides in that the first substrate is integrated to the lower end of the dielectric resin layer with at least one of the electronic components being molded into the dielectric resin layer below the recess to make the circuit block of a unified mold structure. Thus, a substantial part or all of the electronic components can be molded into the dielectric layer to realize the circuit block of a simple and low profile structure, while retaining an advantage of keeping the infrared sensor element sufficiently away from the electronic components and an associated electronic circuit, thereby assuring to give the infrared detector which is simple in construction, economical in cost, and reliable in the infrared detection.

Preferably, the dielectric resin layer is made of a thermo-setting resin mixed with an inorganic filler intermingled in order to give a consolidated structure to the circuit block while embedding the electronic components successfully at the same time of curing the thermo-setting resin.

The dielectric resin layer is preferred to comprise a first resin layer formed with the recess, and a second resin layer embedding therein at least one of the electronic components. In this connection, a shield layer is disposed between the first and second resin layers for connection with a circuit ground of the circuit pattern, and functions to shield the infrared sensor from the electronic circuit in order to give a reliable infrared detection.

The shield layer is preferred to be deposited on top of a second substrate of a thermosetting resin, and be disposed between the first and second resin layers. The second substrate is heat-pressed together with the first and second resin layers so as to be integrated with the first and second resin layers to realize the circuit block.

Alternatively, the shield layer may be a copper foil which is deposited on the second resin layer so as to be integrated into between the first and second resin layers when the first and second resin layers are heat-pressed to form the circuit block.

Further, the circuit block is preferably formed with through-holes extending through the first and second resin layers for electrical connection of the infrared sensor element, the shield layer, and the circuit pattern.

The electronic components may be composed of a plurality of discrete chips which are mounted on a top surface of the first substrate and are molded into the dielectric resin layer.

When the electronic components are composed of a plurality of discrete chips mounted on a top surface of the first substrate, and an integrated circuit chip mounted on a bottom surface of the first substrate, it is preferred that the discrete chips are molded into the dielectric resin layer, while the integrated circuit chip is exposed outwardly of the dielectric resin layer.

When the electronic components are all assembled into an integrated circuit chip, the integrated chip is preferred to be molded into the dielectric resin layer.

Preferably, a spacer is disposed between a base of the detector and the circuit block. The circuit block may be formed on its bottom with lands which are electrically connected respectively to terminal pins extending through the base, while the spacer is formed with openings through which the terminal pins extend respectively for connection with the lands. Thus, the electronic circuit formed on the lower side of the dielectric layer is connected to the terminal pins in a suitable manner.

The base carries the terminal pins composed of a power supply terminal pin, a ground terminal pin, and a signal output terminal pin all extending through the base. At least one of the terminal pins extends through the circuit block for electrical connection with lands which are formed on top of the first resin layer to mount the infrared sensor element. In this instance, one or more of the terminal pins can be bonded on top of the circuit block for easy electrical connection.

Preferably, a top shield projects on top of the circuit block in order to electrically shield the infrared sensor element from at least one of the power supply terminal pins and the signal output terminal pin, thereby protecting the infrared sensor element from receiving undesired electrical signal transmitted through the terminal pins and therefore assuring reliable infrared radiation at the infrared sensor element.

The top shield may be configured to have its lower end embedded into the top end of the circuit block to give an improved shield effect of shielding over a wide range from within the circuit block.

Preferably, the top shield is electrically connected to the shield layer, i.e., the circuit ground of the electronic circuit. In this connection, the top shield projects in a perpendicular relation to a plane of the shield layer from the shield layer and has its upper end above atop surface of the first resin layer where the infrared sensor is mounted.

The top shield may have its top covered with a bulged portion of the first resin layer so as to be integrated into the circuit block and electrically insulated from conductors on top of the circuit block.

The top shield may be formed on an end wall of the first resin layer so that it can be easily realized in the form of a deposited layer on the end wall.

Further, the present invention discloses a unique process of fabricating the infrared sensor. The process is particularly advantageous for fabricating a plurality of the circuit blocks only through a simple molding and embedding technique. The process utilizes a first resin sheet, a first substrate formed with plural sets of discrete circuit patterns, and a second resin sheet. The process comprises the steps of mounting electronic components on each of the discrete circuit patterns, and stacking the first resin sheet and the first substrate with the second resin sheet interposed therebetween. Then, the first resin sheet, the second resin sheet, and the first substrate are heat-pressed together to form a consolidated body in which the electronic components are molded into the cured second resin sheets or the second resin layer. The consolidated body is drilled to form through-holes and followed by being formed on its top with plural sets of lands. Each set of the lands are interconnected to each corresponding one of the circuit patterns by way of the through-holes. After mounting an infrared sensor element on each set of the lands for electrical connection therewith, the consolidated body is cut into a plurality of circuit blocks each having the infrared sensor element and each the circuit pattern. Thus, a plurality of circuit blocks can be obtained by a simple molding technique, and yet at the same time of integrating the electronic components into each of the circuit blocks. Thereafter, each circuit block is mounted on a base and a plurality of terminal pins are inserted into the through-holes and the base to make electrical connections between the terminal pins to the electronic circuit.

Alternatively, the infrared sensor element may be mounted on each of the circuit blocks after the consolidated body is cut into a plurality of the circuit blocks.

These and still other advantageous features of the present invention will become more apparent from the following description of the preferred embodiments when taken in conjunction with the attached drawings.

BRIEF DESCRIPTION OF THE DRAWINGS

FIG. 4 is an exploded perspective view of a circuit block utilized in the above infrared detector;

FIG. 5 is a sectional view of the above circuit block;

FIGS. 6A and 6B are plan views illustrating circuit patterns respectively on the top and bottom faces of a first substrate forming a part of the above circuit block;

BEST MODE FOR CARRYING OUT THE INVENTION

Figure 1:
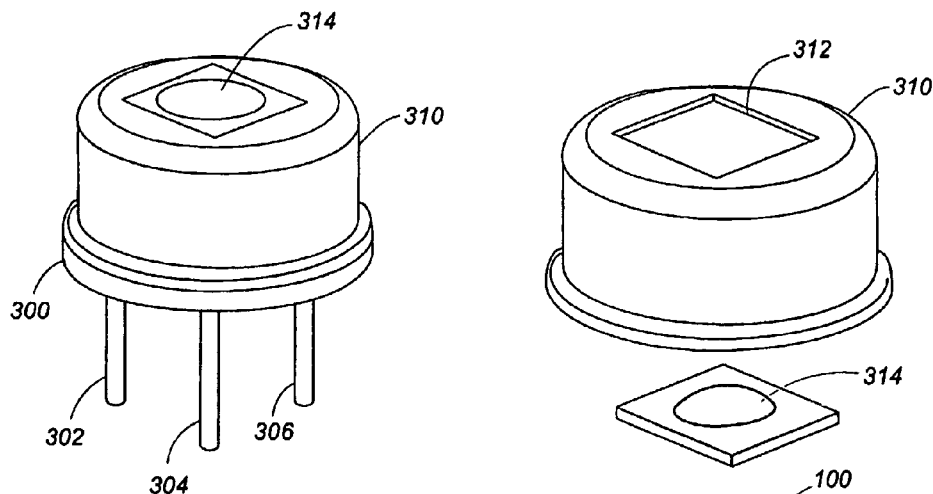
FIG. 1 is a perspective view of an infrared detector in accordance with a first embodiment of the present invention.
Figure 2:
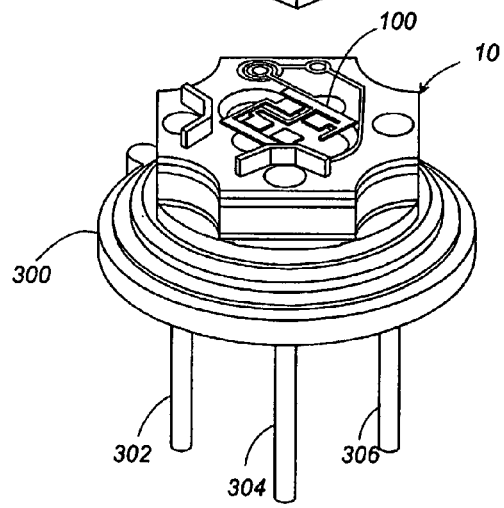
FIG. 2 is an exploded perspective view of the above infrared detector.
Figure 3:
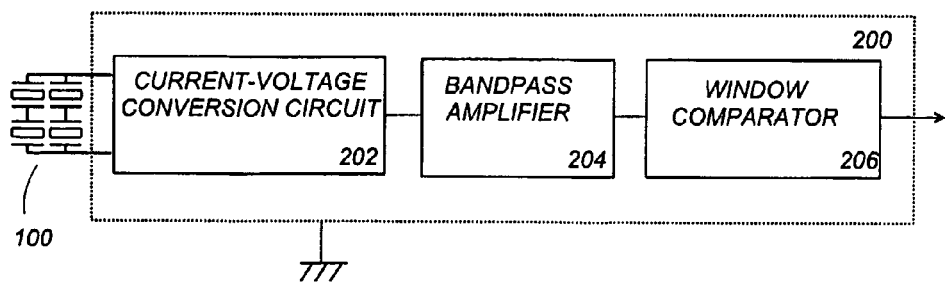
FIG. 3 is a circuit diagram of the above infrared detector.

Referring now to FIGS. 1 to 3, there is shown an infrared detector unit in accordance with a first embodiment of the present invention. The infrared detector is designed to determine a presence of an object or human body emitting an infrared radiation, and includes circuit block 10 carrying a thermal infrared sensor element 100 and a signal processing circuit 200 which is configured to receive a sensor output from the sensor element 100 to analyze the amount of the infrared radiation received at the sensor element for determination of the presence of the object. The infrared sensor element 100 provides a minute electric current in the order of several picoamperes, which is amplified about 4000 times in the signal processing circuit 200 to give an output signal indicative of the presence of the object. The signal processing circuit 200 is realized by electronic components and, as shown in FIG. 3, includes a current-voltage conversion circuit 202 for conversion of the sensor output into a corresponding voltage, a band-pass amplifier 204 which amplifies the voltage within a predetermined frequency range, and a window comparator 206 which compares the amplified voltage with a predetermined threshold to give the output signal. The thermal infrared sensor element 100 is made of a metal such as titanium nitride which gives a varying electric resistance in proportion to the amount or intensity of the incident infrared radiation.

As shown in FIG. 2, the infrared detector comprises a base 300 supporting thereon the circuit block 10 and carrying a plurality of terminal pins, namely, a power supply terminal pin 302, a signal output pin 304, and a ground terminal pin 306, and a cap 310 fitted or the base 300 to surround the circuit block 10. The cap 310 is formed in its top with an opening 312 for receiving an optical lens 314 collecting the infrared radiation to the sensor element 100.

As best shown in FIGS. 4 and 5, the circuit block 10 includes a first substrate 20 and a dielectric layer composed of a first resin layer 30 and a second resin layer 40, which are integrated into a consolidated structure to be assembled on the base 300. The first substrate 20 is formed with circuit patterns on which the electronic components are mounted to realize the signal processing circuit 200. In the present embodiment, the electronic components are composed of a plurality of discrete chips 22 mounted on top of the first substrate 20, and an integrated circuit chip 24 mounted on the bottom of the first substrate 20. For this purpose, the first substrate 20 is formed on its top and bottom respectively with the circuit patterns 26 and 28 which are electrically connected with the discrete chips 22 and the integrated circuit chip 24, as shown in FIGS. 6A and 6B, to establish the signal processing circuit 200 therewith. The first substrate 20 is integrated to the lower end of the second resin layer 40 with the discrete chips 22 molded into the second resin layer 40, as will be discussed in detail hereinafter.

The first resin layer 30 is formed in its center with a recess 32 which defines on its periphery shoulder bearing opposite ends of the sensor element 100. The first resin layer 30 is also formed on its top with lands 34 at portions including the shoulder for electrical connection with the sensor element 100 as well as the signal processing circuit 200 on the first substrate 20. The recess 32 defines an air gap which is responsible for thermally isolating the sensor element 100 effectively from the signal processing circuit 200 at the lower end of the circuit block 10, thereby assuring reliable infrared detection free from the heat generated at the electronic components.

A second substrate 50 is interposed between the first resin layer 30 and the second resin layer 40, and is formed on its top with a shield layer 52 which is connected with the circuit patterns 26 and 28 to define a circuit ground of the signal processing circuit 200 and to shield the infrared sensor element 100 from the signal processing circuit 200, particularly to prevent capacitive coupling between the infrared sensor element and the signal processing circuit 200. Thus, the infrared sensor 100 is well protected from noise or leak from the signal processing circuit 200 for reliable infrared detection. The second substrate 50 is assembled together with the first resin layer 30, the second resin layer 40, and the first substrate 20 to form the consolidated structure. The shield layer 52 is additionally formed with top shields 54 which project upwardly through the first resin layer 30 for shielding the sensor element 100 effectively from the upper ends of the power supply terminal pin 302 and the signal output terminal pin 304. For this purpose, each of the top shields 54 extends perpendicular to a plane of the shield layer 52 to have its upper end projected above the top ends of the terminal pins as well as the lands 34 connecting with the sensor elements and with the terminal pins. The top shields 54 give an additional shielding effect of protecting the infrared sensor element 100 from making capacitive coupling with the terminal pins which are exposed on top of the first resin layer 30 and lead to the signal processing circuit 200, and is particularly effective when the terminal pins are soldered at their respective top ends to the lands 34 on top of the circuit block 10.

The circuit block 10 is formed with a plurality of plated through-holes 12, 14 and 16 which receive the terminal pins 302, 304 and 306 respectively for electrical connection of the sensor element 100 to the signal processing circuit 200 on the first substrate 20. One or more of the through holes are connected to the corresponding land 34 for electrical connection of the sensor element 100 to the signal processing circuit 200.

A spacer 60 is held between the base 300 and the circuit block 10 and is formed with a center cavity 62 for accommodating the integrated circuit chip 24 projecting on the bottom of the circuit block 10 for electrically isolate the chip 24 and the associate circuit pattern 28 from the base 300.

Figure 7A:
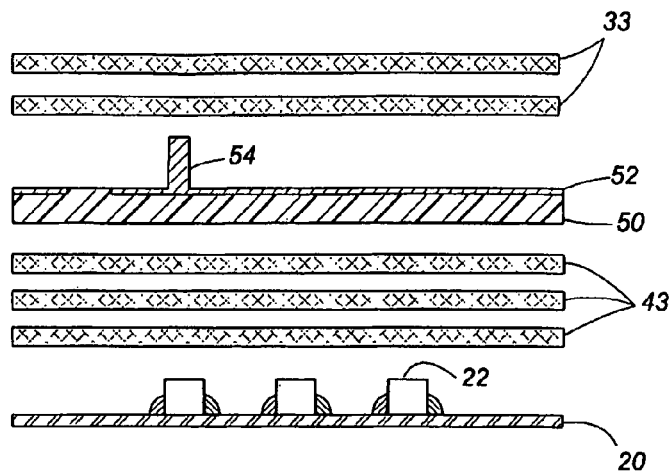
FIG. 7, composed of FIGS. 7(A) to 7(E), are sectional views illustrating process of fabricating the circuit block.
Figure 7B:
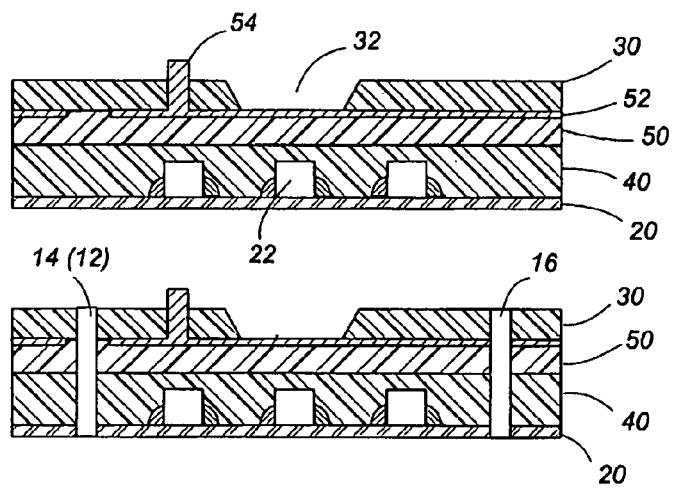

Now referring to FIGS. 7A and 7B, the fabrication of the circuit block 10 is explained in details. Prior to explaining the process of fabricating the circuit block 10, it is mentioned that a plurality of semi-products of the circuit blocks are made simultaneously in a single molding process by use of a first bulk substrate formed with plural sets of discrete circuit patterns each defining the circuit pattern on top of the first substrate 20, and a second bulk substrate formed with a plurality of the shield layers 52. Namely, the first and second bulk substrates are an aggregation of the first substrates 20, and an aggregation of the second substrates 50, respectively. For the sake of simplicity, the figures are depicted to show only one semi-product of the circuit block. In this connection, the first and second bulk substrates may be referred to simply as the first substrate 20 and the second substrate 50, respectively.

After soldering the electronic component chips 22 on top of the bulk substrate, i.e., on each of the first substrates 20, it is held in a molding die together with a plurality of thermosetting resin sheets 42 each in the form of a prepreg of epoxy resin impregnated with an organic filler of silica ($SiO_2$), and the second bulk substrate having plural sets of the shield layers 52, and another set of thermosetting resin sheets 33 of the same prepregs, as shown in FIG. 7(A), to give a stack in the mold. Then, the stack is heat-pressed in vacuum at 100° C. at a pressure of 3 MPa so as to melt the resin sheets 43 and 33 such that the discrete chips 22 are molded in melted resin sheets 43. At the same time, the top shields 54 project though the melted resin sheets 32. Then, the stack is heated up to a temperature of 175° C. to cure the melted resin sheets 33 and 43 to give a consolidated body in which the first substrate 20 is secured to the second substrate 50 through the second resin layer 40 made of the cured resin sheets 43, while the discrete chips 22 are molded into the second resin layer 40, and in which the first resin layer 30 made of the cured resin sheets 33 is secured on top of the second substrate 50 with the top shields 54 projecting above the first resin layer 30, as shown in FIG. 7(B). In this molding process, the recesses 32 are formed in the first resin layer 30. The organic filler is mixed in the epoxy resin, preferably in a high proportion, for example, in an amount of 85 wt % to give toughness and sufficient tensile strength to the resulting cured layers.

Figure 7C:
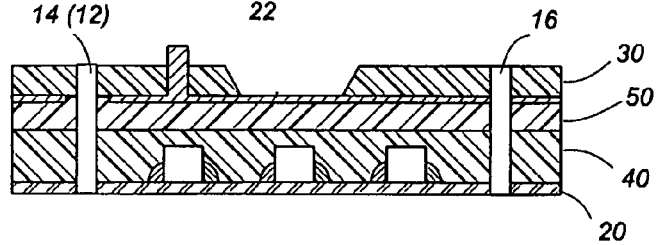
Figure 7D:
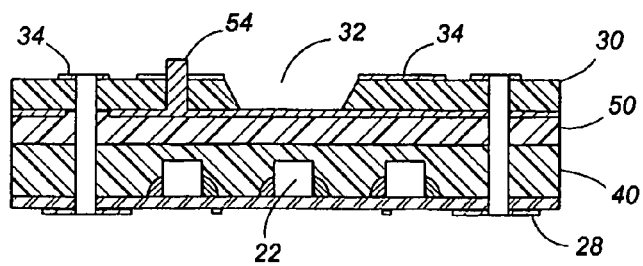
Figure 7E:
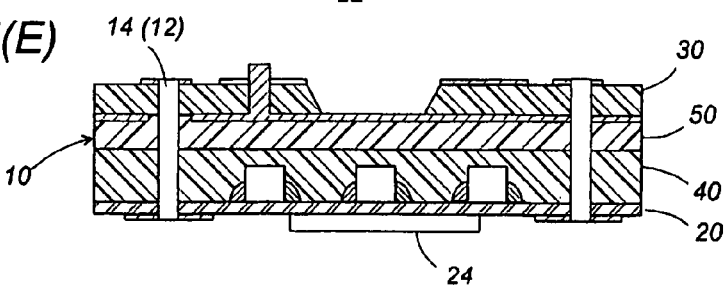

Then, a drilling is made to give a plurality of through-holes 12, 14 and 16 extending vertically through the consolidated body, as shown in FIG. 7(C). Subsequently, the consolidated body is deposited on its top and bottom face respectively with conductive layers of copper, for example, which are subsequently etched to give the lands 34 on top of the first resin layer 30 and the circuit patterns 28 on the bottom of the first substrate 20, as shown in FIG. 7(D). In this process, the through-holes 12, 14, 16 are plated to make electrical interconnection between the lands and the circuit patterns on the first substrate 20. Thereafter, the integrated circuit chips 24 are attached on each of the circuit patterns 28 by a so-called flip-chip mounting, as shown in FIG. 7(E), and the infrared sensor elements 100 are mounted on the first resin layer 30 in such a manner that each sensor element bridges over the corresponding recess 32 and is secured at its opposite ends to the lands 34 on the periphery of the recess. Thus obtained consolidated body is then cut into a plurality of the circuit blocks 10 each of which is subsequently mounted on the base 300 with the terminal pins 302, 304 and 306 extending through the corresponding through holes 12, 14 and 16, and with the spacer 60 interposed between the base 300 and the circuit block 10. The terminal pins are soldered at their upper ends to the corresponding lands 34 on top of the circuit block 10 to complete the electrical connection of the infrared sensor element 100 on top of the circuit block 10 to the signal processing circuit 200 on the bottom of the circuit block 10. Finally, the cap 310 is fitted on the base 300 to surround the circuit block 10 to realize the infrared detector.

Alternatively, the infrared sensor element 100 may be mounted on the first resin layer 30 after the consolidated body is cut into the circuit blocks 10.

When the electronic components forming the signal processing circuit 200 are composed only of the discrete chips 22, the first substrate 20 is formed with a circuit pattern only on its top. In this case, the spacer 60 is not necessary to thereby reduce the overall height of the detector.

Figure 8A:
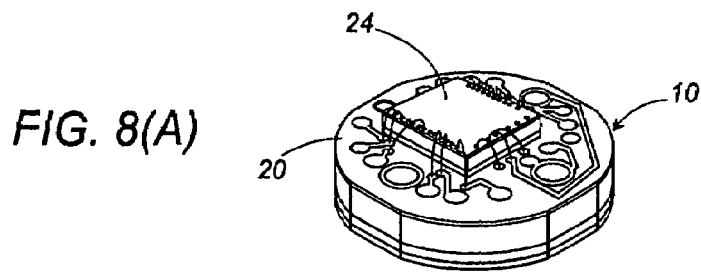
FIG. 8, composed of FIGS. 8(A), 8(B) and 8(C), are perspective views illustrating the electrical connection at the bottom of the circuit block.
Figure 8B:
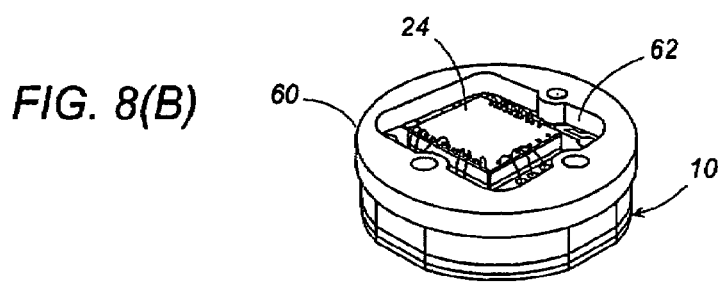
Figure 8C:
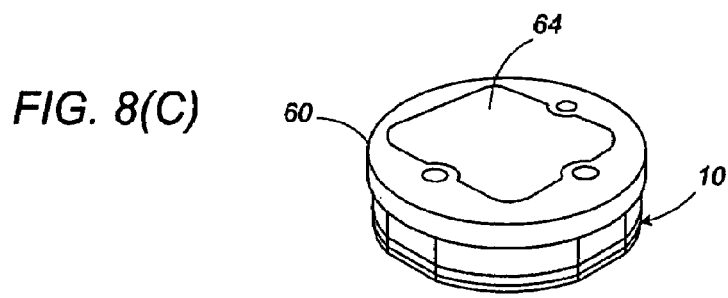

FIGS. 8(A) to 8(C) illustrate a modification of the above embodiment in which the integrated circuit chip 24 is wire-bonded to the bottom of the circuit block 10, or the first substrate 20. In this case, the center cavity 62 of the spacer 60 is filled by a resin 64 to encapsulate the chip 24 within the spacer 60.

Figure 9:
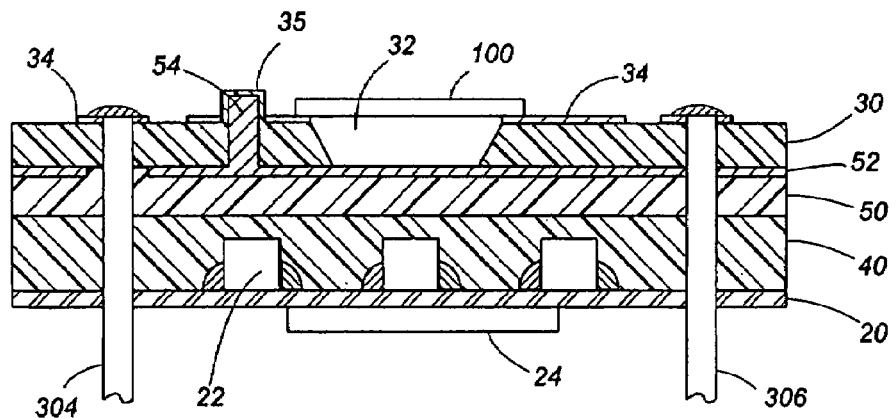
FIG. 9 is a sectional view illustrating a modification of the above circuit block.

FIG. 9 illustrates another modification of the above embodiment in which the top shield 54 has its top end covered by a bulged portion 35 of the first resin layer 30 in order to protect the top shield 54 from undesired conduction with the lands 34 on the top of the circuit block 10.

Figure 10:
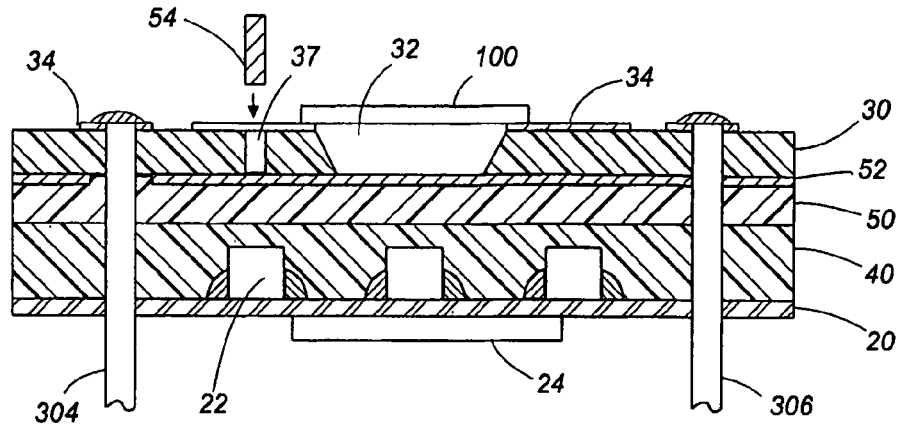
FIG. 10 is an exploded sectional view illustrating another modification of the above circuit block.

Although the top shields 54 are formed integral with the shield layer 52 in the above embodiment, it is equally possible to insert separate top shields 54 into corresponding holes 37 in the first resin layer 30 after molding the circuit block 10, as shown in FIG. 10.

Figure 11:
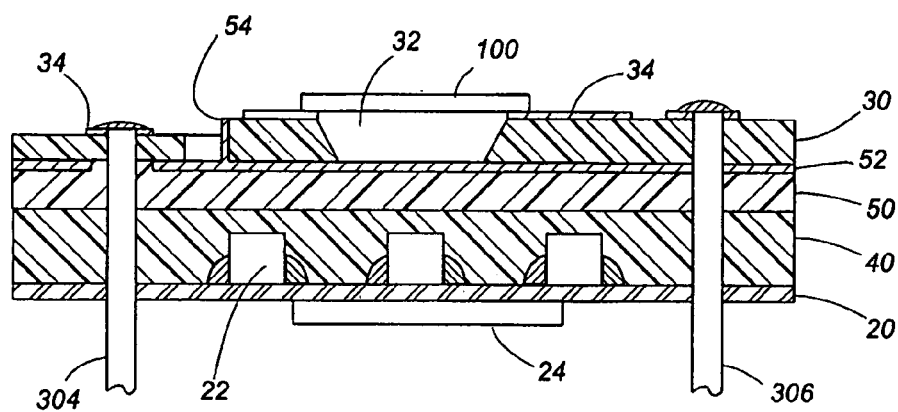
FIG. 11 is a sectional view illustrating a further modification of the circuit block.

Further, as shown in FIG. 11, the top shield 54 may be configured to project from the shield layer 52 and extend upwardly along an end wall of the first resin layer 30 surrounding the recess 32.

Figure 12:
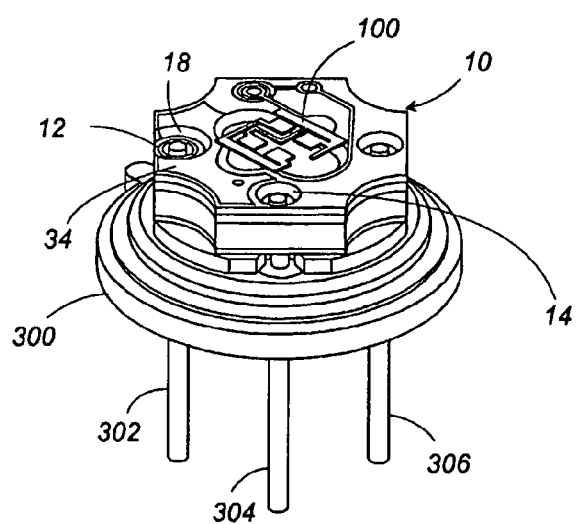
FIG. 12 is a perspective view of a still further modification of the circuit block.

FIG. 12 illustrates a still further modification of the above embodiment in which each of the through-holes 12, 14 and 16 is configured to have a beveled upper edge coated with the plated beveled shield 18 which functions to shield the infrared sensor element 100 from the depressed upper end of the terminal pin in order to eliminate the capacitive coupling between the infrared sensor element 100 and the terminal pin leading to the signal processing circuit 200. The beveled shield 18 may be added only to one or both of the through-holes 12 and 14 respectively receiving the power supply terminal pin 302 and the signal output terminal pin 304.

Figure 13:
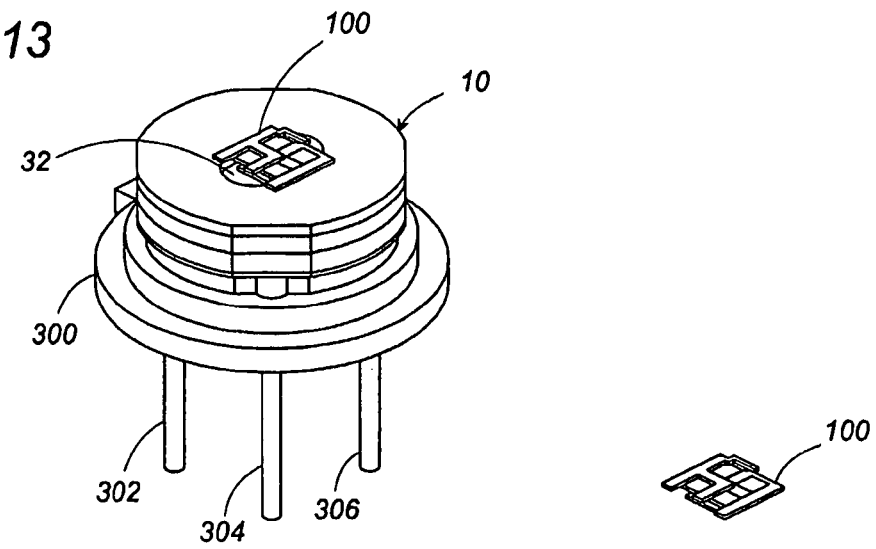
FIG. 13 is a perspective view of an infrared detector in accordance with a second embodiment of the present invention.
Figure 14:
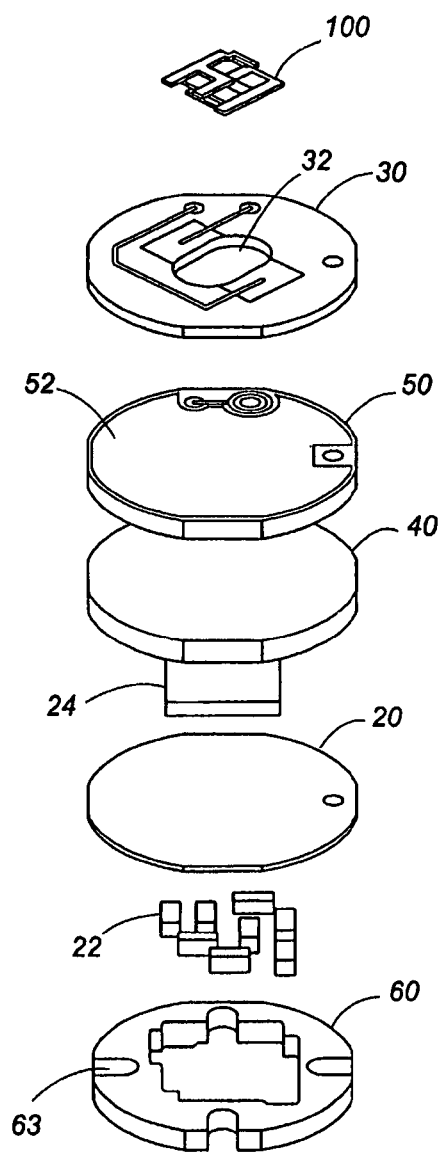
FIG. 14 is an exploded perspective view of the above infrared detector.
Figure 15:
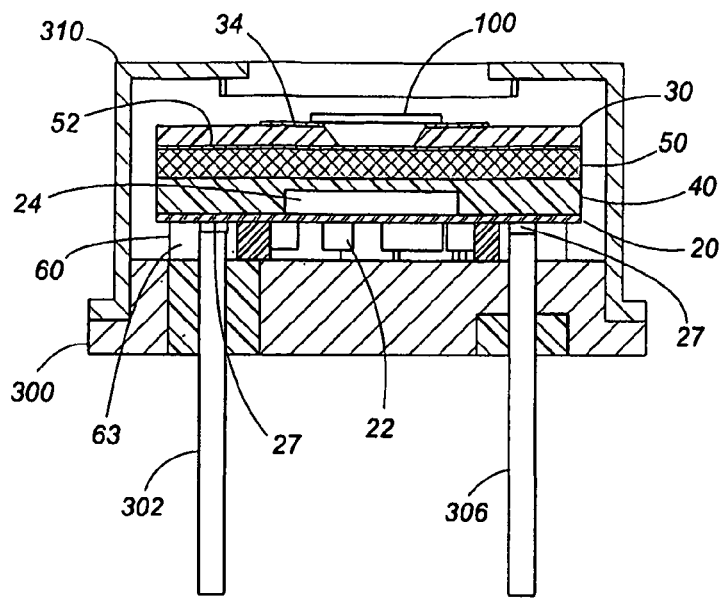
FIG. 15 is a sectional view of the above infrared detector.

FIGS. 13 to 15 illustrate an infrared detector in accordance with a second embodiment of the present invention which is basically identical to the first embodiment except that the terminal pins 302, 304 and 306 are connected respectively at their upper ends to corresponding lands formed on the bottom of the circuit block 10, and that the integrated circuit chip 24 is molded in the second resin layer 40. Like parts are designated by like reference numerals and duplicated explanations are not made herein. The integrated circuit chip 24 is flip-mounted on the first substrate 30 and is molded into the second resin layer 40 at the time of mold-forming the first resin layer 30 and the second resin layer 40 while integrating the first substrate 20 and the second substrate 50 into the resulting consolidated structure. The discrete chips 22 are mounted on the bottom of the first substrate 20 or the bottom of the consolidated structure. The bottom of the first substrate 20 is formed with the lands 27 (only two of which is seen in FIG. 15) which are soldered to the upper ends of the respective terminal pins 302, 304 and 306 at the time of mounting the circuit block 10 on the base 300. The discrete chips 22 are held within a cavity of the spacer 60 to be spaced from the upper end of the base 300. The spacer 60 is formed in its outer periphery with notches 63 through which the terminal pin extends in such a manner as to be capable of being viewed for inspection. In this embodiment, since the top of the circuit block 10 is free from any electrical connection to the terminal pins, no top shields as utilized in the first embodiment is necessary. When the electronic components forming the signal processing circuit 200 can be all realized by the integrated circuit chip 24 to be molded into the circuit block 10, the first substrate 20 is formed with a circuit pattern only on its top and is formed on its bottom only with the lands 27 for connection with the terminal pins.

Figure 16A:
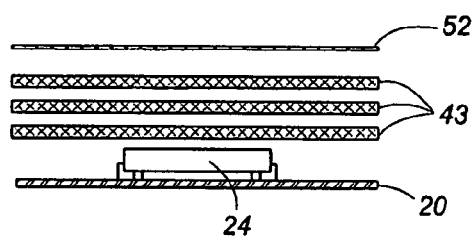
FIG. 16, composed of FIGS. 16(A) to 16(E), are sectional views illustrating the fabrication of the circuit block utilized in the above infrared detector.
Figure 16B:
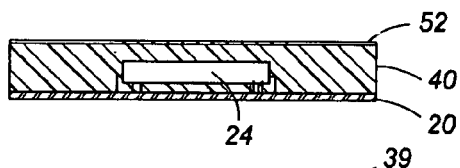
Figure 16C:
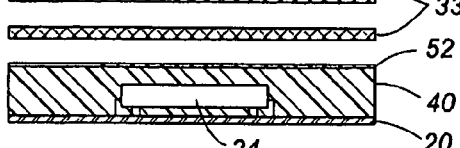
Figure 16D:
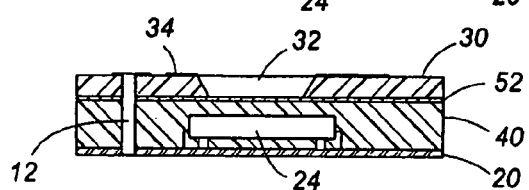
Figure 16E:
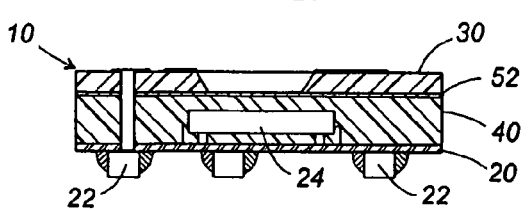

FIGS. 16(A) to 16(E) illustrate the steps of forming the circuit block without using the second substrate 50 but with the use of the shield layer 52 in the form of a foil. First, the shield layer 52 is laminated over the first substrate 20 mounting the integrated chip 24 together with a plurality of resin sheets 43 each in the form of the prepreg to give a stack, as shown in FIG. 16(A). The stack is placed in a molding die and is heat-pressed in a like manner as explained with reference to the first embodiment to give a semi-consolidated body in which the resin sheets 43 are melted and cured to form the second resin layer 40 embedding therein the integrated chip 24, as shown in FIG. 16(B). Then, as shown in FIG. 16(C), a copper foil 39 is laminated over the semi-consolidated body with a plurality of additional resin sheets 33 interposed therebetween. The resulting stack is again heat-pressed to melt and cure the additional resin sheets 33 to obtain a consolidated body in which the additional sheets 33 are cured to give the first resin layer 30 by means of which the copper foil 39 is secured to the semi-consolidated body. Subsequently, the consolidated body or the circuit block 10 is drilled to provide through-holes 12, as shown in FIG. 16(D). Thereafter, the copper foil 39 is etched out to give lands 34 on top of the circuit block 10 for electrical connection with the infrared sensor element 100, while the first substrate 30 is formed on its bottom with a circuit pattern on which the discrete chips 22 are mounted, as show in FIG. 16(E). The through-holes 12 are plated to establish electrical interconnection between the infrared sensor element 100 and the signal processing circuit realized by the chips 22 and 24 at the bottom of the circuit block 10. Thus obtained circuit block 10 is mounted on the base 300 and is surrounded by the cap 310 to give the infrared detector. It is noted in this connection that the processes as explained with reference to FIGS. 16(A) to 16(E) can be suitably combined with the processes explained with reference to FIGS. 7(A) to 7(E) to fabricate the circuit block of the first embodiment or the second embodiment.

Although the above embodiments show the use of the infrared sensor element which exhibits an electrical resistance varying in response to the amount or changing rate of the amount of the incident radiation; it is equally possible to utilize an infrared sensor of a type exhibiting a varying permittivity, of a thermopile type generating a thermal electromotive force, or of a pyroelectric type generating a voltage difference in response to the change rate of the amount of the infrared radiation.

The invention claimed is:

1. An infrared detector comprising:

a circuit block carrying an infrared sensor element and electronic components; and a case enclosing said circuit block, said circuit block comprising a dielectric resin layer and a first substrate formed with a circuit pattern and mounting said electronic components, said dielectric resin layer being formed in its top with a recess which defines around its periphery a shoulder for supporting opposite ends of said infrared sensor element, said recess defining a heat insulation space below said infrared sensor element, said first substrate is integrated to the lower end of said dielectric resin layer with at least one of said electronic components being molded into said dielectric resin layer below said recess to make said circuit block of a unified mold structure, wherein
said dielectric resin layer comprises a first resin layer formed with said recess, and a second resin layer embedding said at least one of the electronic components therein,
a shield layer being disposed between said first and second resin layers for connection with a circuit ground of said circuit pattern.

2. The infrared detector as set forth in claim 1, wherein
said dielectric resin layer is made of a thermo-setting resin and an inorganic filler intermingled with said thermo-setting resin.

3. The infrared detector as set forth in claim 1, wherein
said shield layer is deposited on top of a second substrate made of a thermosetting resin.

4. The infrared detector as set forth in claim 3, wherein
said second substrate is made of a thermosetting resin and is disposed between said first and second resin layers, said second substrate being heat-pressed together with said first and second resin layers so as to be integrated with said first and second resin layers to realize said circuit block.

5. The infrared detector as set forth in claim 1, wherein
said shield layer is made of a copper foil deposited on said second resin layer.

6. The infrared detector as set forth in claim 5, wherein
said copper foil is formed on said second resin layer and is integrated into between said first and second resin layers when said first and second resin layers are heat-pressed to form said circuit block.

7. The infrared detector as set forth in claim 1, wherein
said infrared sensor element, said shield layer, and said circuit pattern are electrically interconnected by way of through-holes respectively extending through said first and second resin layers.

8. The infrared detector as set forth in claim 1, wherein
said electronic components are composed of a plurality of discrete chips which are mounted on a top surface of said first substrate and are embedded into said dielectric resin layer.

9. The infrared detector as set forth in claim 1, wherein
said electronic components are composed of a plurality of discrete chips mounted on a top surface of said first substrate, and an integrated circuit chip mounted on a bottom surface of said first substrate, said discrete chips being molded into said dielectric resin layer, and said integrated circuit chip being exposed outwardly of said dielectric resin layer.

10. The infrared detector as set forth in claim 1, wherein
said electronic components are assembled into an integrated circuit chip which is molded into said dielectric resin layer.

11. The infrared detector as set forth in claim 1, wherein
said case comprises a base and a cap fitted on said base,
a spacer being interposed between said base and said circuit block,
said circuit block being formed on its bottom with lands which are electrically connected respectively to terminal pins extending through said base,
said spacer being formed with openings through which said terminal pins extend respectively for connection with said lands.

12. The infrared detector as set forth in claim 1, wherein
said case comprises a base and a cap fitted on said base, said base carrying a power supply terminal pin, a ground terminal pin, and a signal output terminal pin all extending through said base,
at least one of said terminal pins extending through said circuit block for electrical connection with lands which are formed on top of said first resin layer to mount said infrared sensor element.

13. The infrared detector as set forth in claim 12, wherein
a top shield projects on top of said circuit block to electrically shield said infrared sensor element from at least one of said power supply terminal pins and said signal output terminal, pin.

14. The infrared detector as set forth in claim 13, wherein
said top shield has its lower end embedded into top end of said circuit block.

15. The infrared detector as set forth in claim 13, wherein
said top shield is electrically connected to said shield layer.

16. The infrared detector as set forth in claim 13, wherein
said top shield projects in a perpendicular relation to a plane of said shield layer from said shield layer and has its upper end above a top surface of said first resin layer where said infrared sensor is mounted.

17. The infrared detector as set forth in claim 13, wherein
said top shield has its top covered with a bulged portion of said first resin layer.

18. The infrared detector as set forth in claim 13, wherein
said top shield is formed on an end wall of said first resin layer.

19. A process of fabricating an infrared detector, said process comprising the steps of:
preparing a first resin sheet;
preparing a first substrate formed with a plurality of discrete circuit patterns;
mounting electronic components on each of said discrete circuit patterns;
stacking said first resin sheet and said first substrate with a second resin sheet interposed therebetween, and with a shield layer interposed between said first resin sheet and said second resin sheet, said shield layer being connected to a circuit ground of said circuit patterns;
heat-pressing said first resin sheet, said second resin sheet, and said first substrate together to form a consolidated body in which said electronic components are molded into cured said second resin layer;
forming through-holes in said consolidated body;
forming plural sets of lands on top of said consolidated body;
interconnecting each set of said lands to each corresponding one of said circuit patterns by way of said through-holes;
mounting an infrared sensor element on each set of said lands for electrical connection therewith;
cutting said consolidated body into a plurality of circuit blocks each having said circuit pattern;
mounting each of said circuit blocks on a base; and
inserting a plurality of terminal pins respectively into said through-holes to make electrical connections between said terminal pins to said electronic circuit;
mounting each said infrared sensor element on each set of said lands before or after cutting said consolidated body.

20. A process as set forth in claim 19, wherein
each said infrared sensor is mounted on each set of said lands before cutting said consolidated body to make electrical connections therebetween.

21. A process as set forth in claim 19, wherein
after said consolidated body is cut into a plurality of said circuit blocks each having said circuit pattern, each said infrared sensor is mounted on each set of said lands on said each circuit block for electrical connection therebetween.

* * * * *